June 11, 1968 J. J. McMANUS 3,388,302

CERAMIC HOUSING FOR SEMICONDUCTOR COMPONENTS

Original Filed Oct. 22, 1963 3 Sheets-Sheet 1

INVENTOR.
John J. McManus
BY
Bertha L. MacGregor
ATTORNEY

INVENTOR.
John J. McManus
BY
Bertha L. MacGregor
ATTORNEY

CERAMIC HOUSING FOR SEMICONDUCTOR COMPONENTS

Original Filed Oct. 22, 1963 3 Sheets-Sheet 3

INVENTOR.
John J. McManus
BY
Bertha L. MacGregor
ATTORNEY

United States Patent Office 3,388,302
Patented June 11, 1968

3,388,302
CERAMIC HOUSING FOR SEMICONDUCTOR COMPONENTS

John J. McManus, Manhasset, N.Y., assignor to Coors Porcelain Company, Golden, Colo., a corporation of Colorado Continuation of application Ser. No. 317,893, Oct. 22, 1963. This application Dec. 30, 1966, Ser. No. 609,266
14 Claims. (Cl. 317—234)

ABSTRACT OF THE DISCLOSURE

In accordance with the invention there is provided a housing for semiconductor circuitry which comprises a ceramic base and a ceramic top plate secured together to form the housing, the ceramic base being provided with a series of accurately aligned cavities, each adapted to receive a semiconductor and arranged in a plurality of parallel spaced apart rows with grooves connecting the cavities in each row, each row of interconnected cavities and grooves having on the floor thereof a thin conductive layer bonded to the base for making electrical connection with the semiconductors in the cavities, each of these conductive layers extending over a surface of the ceramic base which is on the exterior of the housing. The top plate is provided with a plurality of parallel spaced apart electrically conductive coatings on the bottom surface thereof and extending across cavities of adjacent rows of cavities in the base for making electrical contact with the semiconductors in the cavities, each of these parallel spaced apart electrically conductive coatings extending over a surface of the top plate on the exterior of the housing. In the preferred embodiment each of the base and top plate is provided with a ledge which extends outwardly of the housing and over which the conductive coatings of the base and top plate, respectively, extend.

This application is a continuation of application, Ser. No. 317,893, filed Oct. 22, 1963, now abandoned.

This invention relates to a microminiature ceramic matrix for high speed semiconductor switching circuitry. The word "microminiature" is used herein to mean "very small." A matrix constructed in accordance with my invention, one embodiment of which is shown in the drawings, comprises a base member and a top plate, each of which may be only .500 inch in width and .660 inch in length, but the invention is not limited to these dimensions.

One of the objects of the invention is to provide a matrix that facilitates rapid assembly of multiple series of diode silicon wafers into a complex miniaturized electronic switching circuit which can readily be incorporated as a single unit into an electronic system. Such systems are employed in computers for driving memory storage units. Use of the miniaturized electronic switching circuit of my invention permits building of much smaller computers than now are known. It can replace the large printed circuit board which now is part of switching circuitry.

The construction of the matrix base shown and described herein provides a series of accurately spaced and aligned square cavities or receptacles for silicon wafer diodes. The cavities are machined to a precise depth, and serve as means for positioning the diodes and as support and protection for the diodes in the finished device.

Between the plurality of cavities I provide a series of novel metallic conductors which are made part of the matrix and serve as diode junctions, electrical conductors and interconnectors with externally located devices. The metallic conductors are produced by interconnecting each cavity by a groove to an external termination recess, and by coating the floor of the cavity, groove and termination recess with an adherent metallic conductor, such as molybdenum-manganese, lithium-molybdate or nickel carboxyl, and subsequently plating the coated surfaces with a gold alloy, such as 99.7% gold and .3% antimony.

Another object of the invention is to provide a plurality of diodes each in the form of a silicon wafer which can be evaluated prior to final assembly and be replaced if necessary without impairing the performance of other silicon components or any section of the circuitry of the device.

Further, I provide in the matrix base accurately spaced slots which serve to align the ceramic top plate electrical conductors with the top of the diodes in the base.

Means also are provided for enclosing all the diodes in one hermetic package which, however, allows for the feeding through of metallic conductors. Thus I eliminate the necessity of providing for individual diode packages and achieve greater packaging density.

Another object of the invention is to produce a matrix for the purposes described which embodies superior heat conducting materials. The base and top plate of the matrix are made of high purity aluminum oxide and/or beryllium oxide. The efficient removal of heat from the device results in more stable performance, higher reliability and longer life than has heretofore been attained in switching systems.

Other objects and advantages will be apparent from the drawings and following specification.

Figures 1, 2, 3:
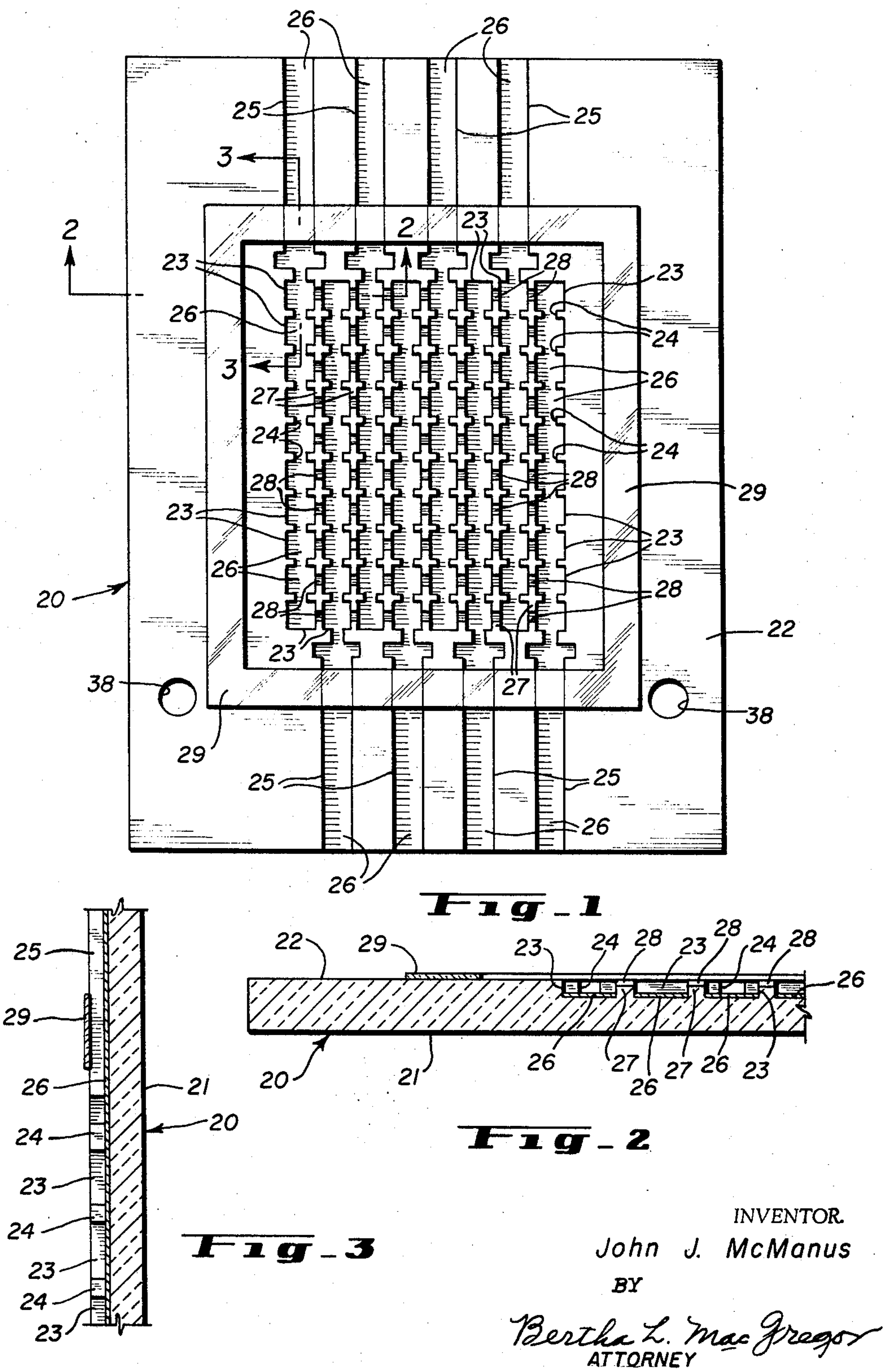
FIG. 1 is a top plan view of the base member of a matrix embodying my invention.
FIG. 2 is a transverse vertical sectional view on an enlarged scale, in the plane of the line 2—2 of FIG. 1.
FIG. 3 is a longitudinal vertical sectional view on an enlarged scale, in the plane of the line 3—3 of FIG. 1.

Referring first to FIGS. 1–3, in that embodiment of the invention shown in the drawings, the ceramic base 20 is rectangular and has a flat bottom 21 and flat top surface 22. The ceramic material preferably is high purity aluminum oxide and/or beryllium oxide which has superior heat conduction properties. The flat top is provided with a plurality of series of square cavities 23 of uniform depth, arranged in parallel rows extending longitudinally of the base 20. The cavities 23 of each row are connected by grooves 24 of the same depth as the cavities, said grooves being located midway between the sides of the cavities and aligned longitudinally of the base. The end groove 24 of each row communicates with an elongated termination recess 25 of the same depth as the cavities 23 and grooves 24. The termination recesses 25 extend from alternate rows of cavities toward one end of the base and from the other rows of cavities toward the opposite end of the base.

The cavities 23 are square, flat bottomed, machined to a precise depth, and accurately spaced and aligned. The cavities 23, grooves 24 and termination recesses 25 have floor surfaces in one horizontal plane. The floor surfaces are coated with an adherent metallic conductor which may be molybdenum-manganese, lithium-molybdate or nickel carboxyl. The metallic conductor coating need be only .0001–.0002" thick, and is subsequently plated with a gold alloy such as 99.7% gold and .3% antimony, making the conductors .002" thick. The plated metallic conductors on the floors of the cavities 23, grooves 24 and termination recesses 25 are indicated at 26.

The cavities 23 of each longitudinally extending row of cavities are precisely opposite the adjacent cavity of an adjacent row, the adjacent cavities being separated by a narrow partition 27 slotted as indicated at 28, to form an open top clearance groove which extends transversely of the base across the center of transversely aligned cavities 23 for receiving and positioning top plate electrical conductors to be described hereinafter. The slots 28 are not metallized.

A glass frame 29, thin, flat and rectangular in shape, rests on the base 20 to surround the cavities 23 and grooves 24, and crosses the termination recesses 25 as shown in FIG. 1.

After the application of the metallic conductor coating and plating 26 to the floor of the cavities 23, grooves 24 and termination recesses 25, the base cavities receive and support silicon wafer diodes 30, not shown in FIGS. 1–3, but shown in the assembled matrix (FIGS. 6–10).

Figure 4:
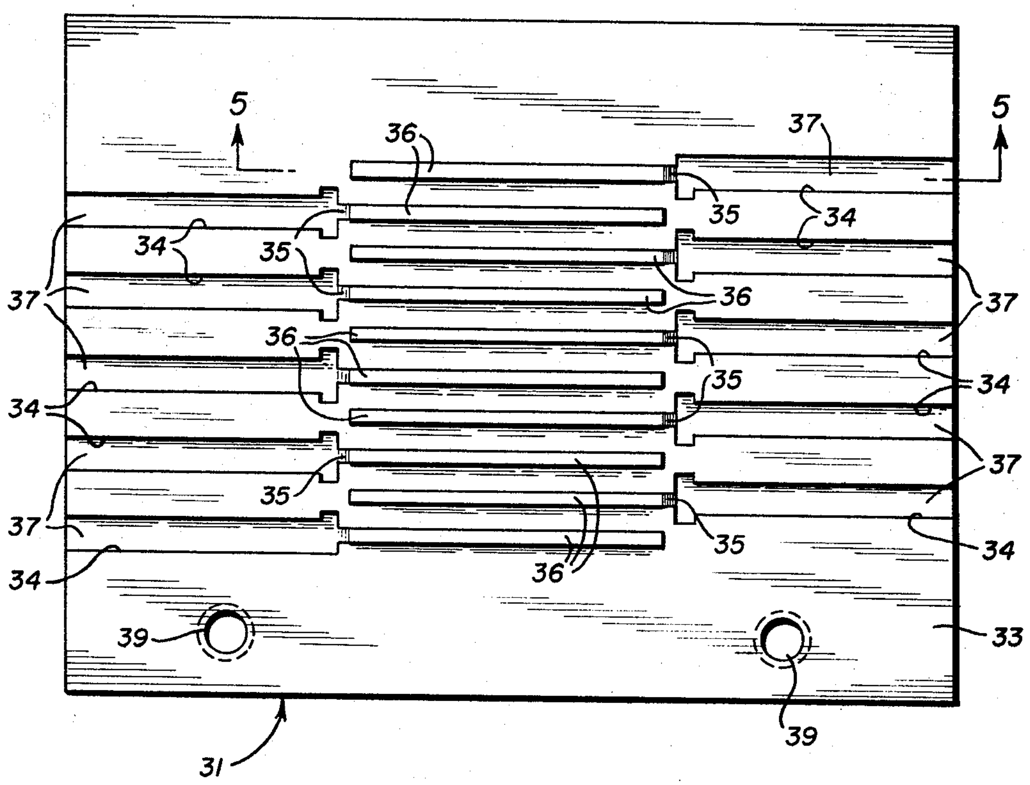
FIG. 4 is a bottom plan view of the top plate of the matrix embodying my invention.
Figure 5:
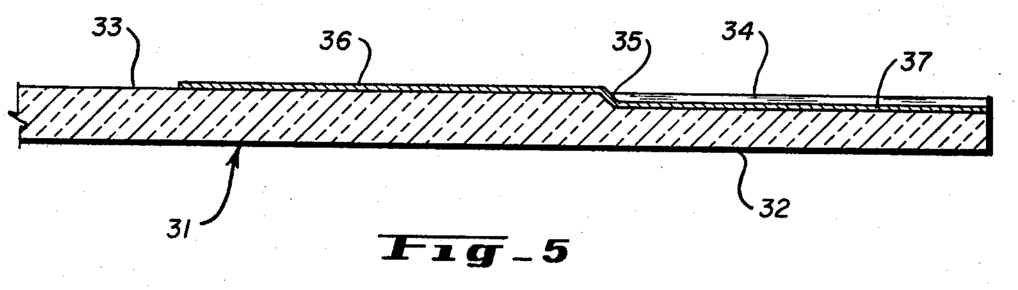
FIG. 5 is a transverse vertical sectional view on an enlarged scale, in the plane of the line 5—5 of FIG. 4.

A top plate 31 is shown in FIGS. 4 and 5. It is made of the same ceramic material as the base 20, and preferably is rectangular in shape and has the same top and bottom surface dimensions as the base. The top surface 32 is flat. The bottom surface 33 also is flat but recessed to provide termination recesses 34. Inclined surfaces 35 join the bottom surface 33 to the recesses 34. A series of narrow, elongated, parallel surfaces of the bottom 33 are metallized and gold plated to form electrical conductors 36 as shown in FIG. 4. The conductors 36 extend longitudinally of the top plate 31 but transversely of the base 20, in the clearance grooves formed by the slots 28, in the assembled matrix as shown in FIGS. 6–10. The conductors 36 are connected to termination conductors 37 produced by metallizing and plating the termination recesses 34. The conductors 37 extend from alternate conductors 36 to one side edge of the top plate and from the other conductors 36 to the opposite side of the top plate, as shown in FIG. 4. The metallizing and plating is the same as described in connection with the coating 26.

Figures 6, 7:
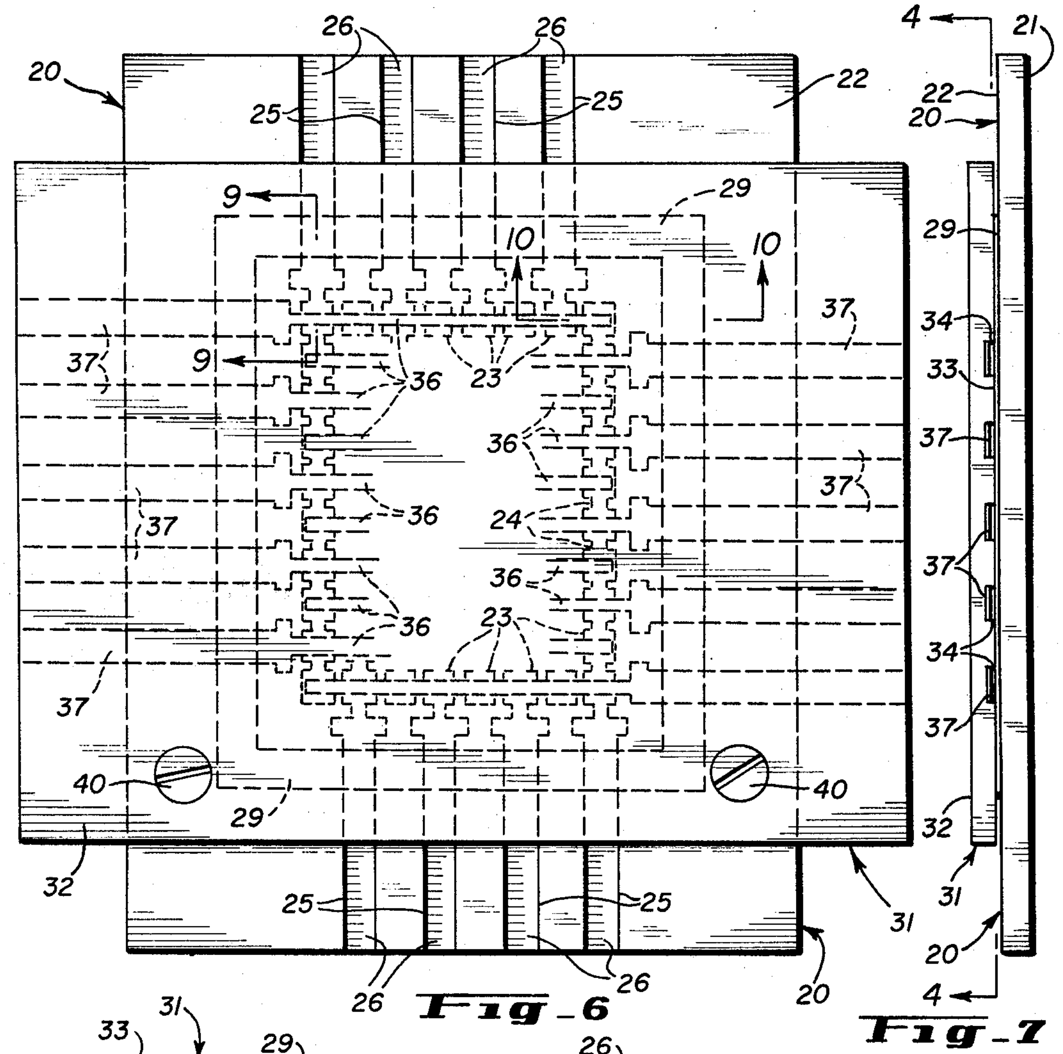
FIG. 6 is a top plan view of the assembled base and top plate of FIGS. 1 and 4 which form the matrix, with diodes in the base cavities, showing in dotted lines the conductors of the top plate overlying the diodes and conductors in the base.
FIG. 7 is an elevational view showing the longitudinal side of the base and end of the top plate thereon.
Figure 8:
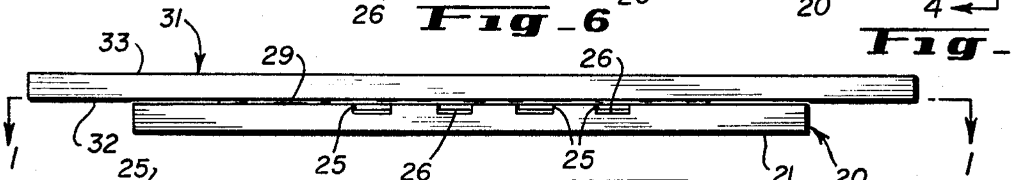
FIG. 8 is an elevational view showing the end of the base and longitudinal side of the top plate thereon.
Figure 9:
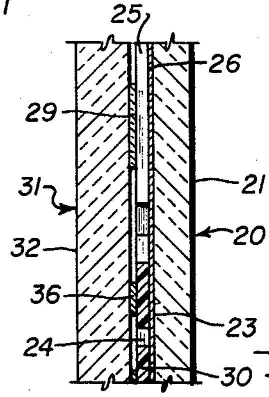
FIG. 9 is a longitudinal vertical sectional view, on an enlarged scale, in the plane of the line 9—9 of FIG. 6.
Figure 10:
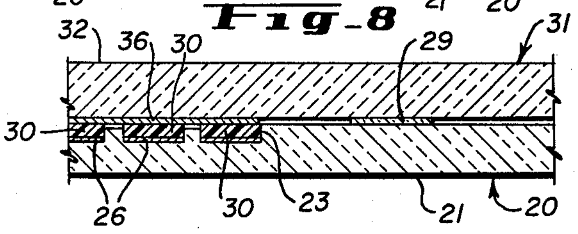
FIG. 10 is a transverse vertical sectional view, on an enlarged scale, in the plane of the line 10—10 of FIG. 6.

Referring to FIGS. 6–10, the assembled matrix comprises the base member 20 and top plate 31, silicon wafer diodes 30 and glass frame 29. The top plate 31 has its surface 32 on top and the surface 33 with electrical conductors 36, 37, thereon, facing downwardly. In the assembled positions of the two major parts, the longitudinal dimension of the top plate extends transversely of the base, so that electrical conductors 36 on the bottom of the top plate extend at right angles across the electrical conductors 26 in the rows of cavities 23 and grooves 24 of the base 20, and across the silicon wafer diodes 30 in the cavities 23. Thus the termination conductors 37 are accessible at opposite sides of the assembly and the conductors 26 are accessible at opposite ends of the assembly as shown in FIGS. 6, 7 and 8.

Registering holes 38 and 39 in the base 20 and top plate 31, respectively, receive countersunk screws 40, for final assembly of the parts in accurately aligned relationship.

Changes may be made in the dimensions and details of construction and form of some of the parts without departing from the scope of the invention. For example, the position of the termination conductors 26 and 37 on all four sides of the assembly is desirable for certain switching applications, but where all terminations are desired on one side only, minor modification of the conductor configuration can be made within the scope of the invention.

The embodiments of the invention in which an exclusive property or privilege is claimed are defined as follows:

1. A ceramic matrix for high speed semiconductor switching circuitry which comprises (a) a ceramic base provided with (a–1) a series of accurately aligned cavities arranged in a plurality of parallel spaced apart rows, (a–2) grooves connecting the cavities in each row, (a–3) a termination recess in the base located at an end of each row of cavities in communication with the cavities and grooves of the row, (a–4) an electrically conductive coating on the floor of the cavities, grooves and termination recess of each row, (b) a diode in each cavity in contact with the conductive coating, (c) a ceramic top plate provided with (c–1) a plurality of parallel spaced apart electrically conductive coatings on the bottom surface of the top plate each extending across cavities of adjacent rows of cavities in the base and in contact with the diodes in said cavities, (c–2) a termination electrically conductive coating connected to an end of each of said parallel spaced apart electrically conductive coatings on said top plate, (d) means connecting the base and top plate together in superposed relationship, and means between said base and top plate surrounding the recesses in the base and providing an hermetic seal for all the diodes in one package.

2. The ceramic matrix defined by claim 1 in which the ends of the base extend beyond the side edges of the top plate, and the ends of the top plate extend beyond the side edges of the base, whereby the conductive material in the base termination recesses and the termination electrically conductive coatings of the top plate are exposed and accessible externally of the matrix.

3. A microminiature ceramic matrix for high speed semiconductor switching circuitry, which comprises (a) a ceramic base provided in its top with (a–1) a series of accurately aligned cavities arranged in a plurality of parallel spaced apart rows extending longitudinally of the base, (a–2) grooves connecting the cavities in each row, (a–3) a termination recess in the base located at an end of each row of cavities in communication with the cavities and grooves of the row, (a–4) the cavities, grooves and termination recess being of equal depth, (a–5) an electrically conductive coating on the floor of the cavities, grooves and termination recess of each row, (b) a diode in each cavity in contact with the conductive coating, (c) a ceramic top plate provided with (c–1) a plurality of parallel spaced apart electrically conductive coatings on the bottom surface of the top plate each extending across cavities of adjacent rows of cavities in the base and in contact with the diodes in said cavities, (c–2) a termination electrically conductive coating connected to an end of each of said parallel spaced apart electrically conductive coatings on said top plate, (d) means connecting the base and top plate together in superposed relationship, and means between said base and top plate surrounding the recesses in the base and providing an hermetic seal for all the diodes in one package.

4. The microminiature ceramic matrix defined by claim 3 in which the cavities of adjacent rows are separated by a narrow partition which is slotted transversely between adjacent cavities, and the electrically conductive coatings of the top plate extend transversely of the base in said slots and are thereby aligned with the diodes in the base.

5. The microminiature ceramic matrix defined by claim 3 in which the ends of the base extend beyond the side edges of the top plate, and the ends of the top plate extend beyond the side edges of the base, whereby the conductive material in the base termination recesses and the termination electrically conductive coatings of the top plate are exposed atnd accessible externally of the matrix.

6. The microminiature ceramic matrix defined by claim 3 in which the base and top plate are made of high purity aluminum oxide.

7. The microminiature ceramic matrix defined by claim 3, in which the base and top plate are made of high purity beryllium oxide.

8. A microminiature ceramic matrix for high speed semiconductor circuitry which comprises (a) a ceramic base provided with (a–1) a series of accurately aligned cavities arranged in a plurality of parallel spaced apart rows, the cavities of each row being interconnected by grooves, (a–2) a termination recess in the base located at an end of each row of cavities in communication therewith, (a–3) an electrically conductive coating on the floor of the cavities, interconnecting means and termination recess of each row, (b) a diode in each cavity in contact with the conductive coating, (c) a glass frame on the base surrounding the rows of cavities and extending across the termination recesses, (d) a ceramic top plate provided with (d–1) a plurality of parallel spaced apart electrical conductors on the bottom surface of the plate each extending across cavities of adjacent rows of cavities in the base and in contact with the diodes in said cavities, (d–2) a termination electrical conductor connected to an end of each of said conductors on said top plate, and (e) means connecting the base and top plate together in superposed relationship with the glass frame between them.

9. The microminiature ceramic matrix defined by claim 8 in which the electrical conductors in the base and top plate are accessible externally of the matrix.

10. The microminiature ceramic matrix defined by claim 8 in which the diodes are silicon wafers.

11. The microminiature ceramic matrix defined by claim 8, in which the termination recesses extend from alternate rows of cavities in the base to one end of the base and from the other recesses to the opposite end of the base.

12. The microminiature ceramic matrix defined by claim 8 in which the termination electrical conductors extend from alternate electrical conductors on the bottom surface of the top plate to one end of the top plate and from the other electrical conductors to the opposite end of the top plate.

13. A ceramic package for semiconductor circuitry comprising a ceramic base provided with a series of aligned cavities each adapted to receive a semiconductor and arranged in a plurality of parallel spaced apart rows with grooves connecting the cavities in each row, an electrically conductive coating on the floor of the cavities and the grooves of each row for making electrical contact with the semiconductors in the cavities of the row, a ceramic top plate provided with a plurality of parallel spaced apart electrically conductive coatings on the bottom surface of said top plate, each of said plurality of conductive coatings extending across cavities of adjacent rows of cavities in the base for making electrical contact with the semiconductors in the cavities, and means connecting the base and top plate together in super-imposed relationship to form the package, each of said electrically conductive coatings of said base member having a termination portion which extends over a surface of said base member on the exterior of said package and each of the electrically conductive coatings on said top plate having a termination portion extending over a surface of said top plate on the exterior of said package.

14. A ceramic package as set forth in claim 13 wherein the ceramic base has an edge portion which extends beyond an edge of said top plate thereby providing an exterior ledge on said package, said ledge being the exterior surface of said base over which the termination portion of each of said electrically conductive coatings of said base extends, and said top plate having an edge portion which extends beyond an edge of said base thereby providing a second ledge on the exterior of said package, said second ledge being the exterior surface of said top plate over which the termination portion of each of the electrically conductive coatings of said top plate extends.

References Cited

UNITED STATES PATENTS

| | | | |
|---|---|---|---|
| 3,072,832 | 1/1963 | Kilby | 317—235 |
| 3,195,026 | 7/1965 | Wegner et al. | 317—234 |
| 3,271,625 | 9/1966 | Caracciolo | 317—101 |
| 3,271,634 | 9/1966 | Heaton | 317—234 |
| 3,292,241 | 12/1966 | Carroll | 29—155.5 |

JOHN W. HUCKERT, *Primary Examiner.*

R. E. SANDLER, *Assistant Examiner.*